United States Patent

Mostafazadeh et al.

[11] Patent Number: 5,986,340
[45] Date of Patent: Nov. 16, 1999

[54] BALL GRID ARRAY PACKAGE WITH ENHANCED THERMAL AND ELECTRICAL CHARACTERISTICS AND ELECTRONIC DEVICE INCORPORATING SAME

[75] Inventors: Shahram Mostafazadeh, Santa Clara; Joseph O. Smith, Morgan Hill, both of Calif.

[73] Assignee: National Semiconductor Corporation, Santa Clara, Calif.

[21] Appl. No.: 08/641,933

[22] Filed: May 2, 1996

[51] Int. Cl.$^6$ .......... H01L 23/34; H01L 23/495; H01L 23/48; H01L 23/04
[52] U.S. Cl. .......... 257/713; 257/675; 257/697; 257/698; 257/706; 257/780; 257/707
[58] Field of Search .......... 257/675, 697, 257/693, 692, 698, 706, 780, 707, 717, 712, 713

[56] References Cited

U.S. PATENT DOCUMENTS

| | | | |
|---|---|---|---|
| 4,691,225 | 9/1987 | Murakami et al. | 357/80 |
| 4,705,606 | 11/1987 | Young et al. | 204/15 |
| 5,193,053 | 3/1993 | Sonobe | 257/675 |
| 5,488,254 | 1/1996 | Nishimura et al. | 257/675 |
| 5,532,513 | 7/1996 | Smith et al. | 257/706 |
| 5,552,636 | 9/1996 | Darveaux | 257/717 |
| 5,675,474 | 10/1997 | Nagase et al. | 257/707 |

FOREIGN PATENT DOCUMENTS

| | | | |
|---|---|---|---|
| 405136302 | 6/1993 | Japan | 257/675 |

*Primary Examiner*—Steven H. Loke
*Attorney, Agent, or Firm*—Skjerven, Morrill, MacPherson, Franklin & Friel, LLP; Edward C. Kwok; Glen B. Choi

[57] ABSTRACT

A ball grid array (BGA) package incorporating a heat dissipating member which includes a thin die attach portion mounted between an integrated circuit chip (die) and a package substrate, a heat sink portion surrounding the die attach portion, and tie bars connected between the die attach portion and the heat sink portion. The die attach portion is thinner than the heat sink portion such that a recessed area is formed for receiving an integrated circuit die. Heat generated by a die mounted on the die attach portion is transmitted to the heat sink portion along the tie bars, thereby providing enhanced thermal characteristics. Inductive effects on signals passing between the integrated circuit die and a host printed circuit board are reduced by connecting the heat dissipating member to a ground potential. A Faraday cage is formed around the integrated circuit die by mounting a metal plate on the upper peripheral surface of the heat sink portion.

9 Claims, 5 Drawing Sheets

BALL GRID ARRAY PACKAGE WITH ENHANCED THERMAL AND ELECTRICAL CHARACTERISTICS AND ELECTRONIC DEVICE INCORPORATING SAME

BACKGROUND OF THE INVENTION

1. Field of the Invention

This invention relates to integrated circuit packages and to electronic devices incorporating integrated circuit packages.

2. Description of the Prior Art

An integrated circuit (IC) package is a structure used to electrically connect an IC die (chip) to a printed circuit board (PCB) or other host structure. Each die typically includes input/output (I/O) terminals which are arranged along a peripheral edge of the die. After the die is mounted on a package, the I/O terminals are electrically connected to bonding pads formed on the package using, for example, wire bond techniques. The package typically includes conductive lines which are electrically connected to external contacts such as, for example, pins, leads or solder bumps. When the package is mounted onto a PCB, electrical signals are transmitted between the PCB and the die through these external contacts.

Recent develops in IC fabrication have resulted in dies with increasingly-large numbers of I/O terminals, and which generate increasingly-large amounts of heat. In addition, certain electronic devices, such as those used in wireless or telecommunication applications, are increasingly sensitive to electromagnetic interference (EMI) and radio frequency interference (RFI).

To keep pace with the developments in IC fabrication, there is an on-going need for IC packages having improved electrical characteristics and thermal characteristics. The term "electrical characteristics" is used herein to refer to a package's effective inductance and to the package's ability to shield electromagnetic interference (EMI) and radio frequency interference (RFI). "Improved" electrical characteristics refers to reduced effective inductance and greater EMI/RFI shielding. The term "thermal characteristics" is used herein to refer to a package's ability to dissipate a large amount of heat generated during operation of the die such that the die is maintained at an optimal operating temperature.

Present integrated circuit packages capable of handling a large number of interconnections include ball grid array (BGA) packages.

FIG. 1(A) is a cross-sectional view of a standard plastic BGA (PBGA) package 10 including an integrated circuit die 12 mounted on an upper surface of a substrate 14. Substrate 14 includes inner bonding pads 16 formed on the upper surface and outer bonding pads 18 formed on the lower surface of substrate 14. Conductive vias 19 are formed through substrate 14 and are electrically connected to the outer bonding pads 18. Conductive leads (not shown) are formed on the upper surface of substrate 14 which connect each inner bond pad 16 with one of the conductive vias 19. Wires 20 are connected between die bond pads 22, located on die 12, and inner bond pads 16. Die bond pads 22 are electrically connected to the integrated circuit fabricated on die 12. Solder balls 26 are connected to outer bond pads 18 for electrical connection to a host PCB (not shown). A plastic cover 24 is molded over die 12 and wires 20 for protection.

Beneficial electrical characteristics of standard PBGA package 10 arise from the short signal paths between die 12 and solder balls 26. That is, the effective inductance of standard PBGA package 10 on the performance of die 12 is relatively low due in part to the short signal path distances between die 12 and solder balls 26.

A problem with the electrical characteristics of standard PBGA package 10 is that it provides inadequate EMI/RFI protection in many wireless and telecommunication devices. This problem arises because the only protection from EMI/RFI is plastic cover 24. Of course, a shield may be placed over the plastic cover 24, but the shield would require a ground connection to be effective, and may not adequately shield EMI/RFI.

Another problem with standard PBGA package 10 is that it has relatively poor heat dissipation capabilities. Typically, heat generated by die 12 is transmitted through substrate 14 and solder balls 26 to an underlying PCB. However, in peripheral array PBGA packages in which the solder balls are placed around a perimeter of the substrate (that is, not underneath the die), heat generated by the die becomes trapped within the package, thereby causing a substantial increase in die temperature. This is a particular problem with peripheral PBGA arrays when a plastic substrate is used because the die is completely encapsulated in plastic, which is a poor heat conductor.

It is therefore highly desirable to provide a BGA package which has improved electrical and thermal characteristics.

FIG. 1(B) shows a known BGA package which addresses some of the above-mentioned problems associated with standard PBGA package 10. The BGA package shown in FIG. 1(B) is referred to as a "super", "cavity", or "cavity down" BGA package (hereafter referred to as a "super BGA package").

Referring to FIG. 1(B), super BGA package 100 includes a substrate 101 provided with a recessed central cavity 102. A heat-conducting copper plate 103 is mounted on a first surface of substrate 101, and a die 104 is mounted on copper plate 103. Die 104 is thermally connected to copper plate 103 and electrically connected to first bonding pads formed on a second surface of substrate 101 by wires 105 using conventional wire bonding methods. A resin dam 106 is formed on the second surface of substrate 101 to contain a resin-based encapsulation material 107 formed over die 104 and wires 105. Finally, solder balls 108 are mounted on the second surface of substrate 101 such that each solder ball 108 contacts one of a plurality of second bonding pads. The first and second bonding pads are connected by conductive leads formed on the upper surface of substrate 101.

Super BGA package 100 has better thermal characteristics than the standard PBGA package 10 because die 104 is directly attached to copper plate 103, which is an excellent heat conductor. Therefore, heat generated by die 104 is effectively transmitted away from die 104 by copper plate 103. Further, wires 105 and solder balls 108 are located on the same side of super BGA package 100. Therefore, die 104 is partially protected from EMI/RFI by copper plate 103 while maintaining an overall thickness which is typically less than standard PBGA package 10.

A problem arises with the electrical characteristics of super BGA package 100 because signals passing from die 104 to solder balls 108 must traverse relatively long conductive paths. These long conductive paths cause the effective inductance of super BGA package 100 to be significantly greater than the effective inductance of standard PBGA package 10.

Further, super BGA package 100 differs from standard PBGA package 10 (see FIG. 1(A)) in that the bonding pads (not shown) of die 104 and solder balls 108 face in a common direction Y (that is, upward in FIG. 1(B)). Therefore, wire bonding and solder ball attachment are performed on the same side (the upward-facing side in FIG. 2(B)), which is the side facing a PCB when super BGA package 100 is mounted on the PCB. This "cavity down" arrangement creates a problem in that it is not possible to apply test probes to die 104 after die attach to test for incomplete or faulty connections to the package. During probe testing, BGA packages are typically placed onto a flat test fixture such that solder balls 108 electrically contact a series of test pads formed on the test member. The test probe is then contacted onto the bonding pads of the die to test the wire bond connections. Probe testing is easily carried out on standard PBGA package 10. However, it is impossible to use this testing procedure with super BGA package 100 because, as mentioned above, die 104 and solder balls 108 face in the same direction (toward the test fixture), thereby making it impossible to apply the probes to the die bonding pads when solder balls 108 are contacting the test fixture.

It is therefore highly desirable to provide a PBGA package which provides enhanced electrical and thermal characteristics.

SUMMARY OF THE INVENTION

The present invention is directed to a BGA package which combines probe testability and low effective inductance with improved shielding and thermal characteristics, thereby providing a BGA package which is superior to both standard PBGA and super BGA packages.

In accordance with one aspect of the present invention, a heat dissipating member includes a flat die attach portion and a heat sink portion surrounding the die attach portion. The heat sink portion is thicker than the die attach portion, thereby forming a recessed area in which the die attach portion forms a bottom wall and which is bounded by an inner surface of the heat sink portion. Spaced-apart rod-like tie bars extend between an outer peripheral edge of the die attach portion and an inner peripheral edge of the heat sink portion. Openings are formed between the tie bars. When an integrated circuit die (chip) is mounted on the die attach portion, an upper surface of the die is located below the upper surface of the heat sink portion such that a metal plate can be mounted over the recessed area to form a Faraday cage with the heat dissipating member which blocks electromagnetic interference (EMI) and radio frequency interference (RFI). Further, the heat sink is connected to a ground source to establish a ground plane, thereby reducing the effective inductance of the BGA package. Therefore, a BGA package incorporating the heat dissipating member of the present invention exhibits electrical characteristics which are superior to both standard PBGA and super BGA packages. Further, heat generated by the die is transmitted from the die attach portion to the heat sink portion along the tie bars, thereby providing enhanced thermal characteristics over standard PBGA packages.

In accordance with another aspect of the present invention, an electronic device is produced using a BGA package which includes a substrate having a first surface upon which the heat dissipating member is mounted. The first surface includes upper bonding pads which are exposed through the openings formed between the heat sink portion and the die attach portion of the heat dissipating member. The die is mounted on the die attach portion using known techniques, and then connected to the upper bonding pads using known wire bonding methods. During wire bonding, wires are connected between bonding pads formed on the die and the upper bonding pads through the openings. The substrate also includes a lower surface having a plurality of lower bonding pads. A plurality of solder balls or solder columns are then mounted to lower surface such that each solder ball/column is connected to one of the lower bonding pads. The substrate includes conductive vias and leads which electrically connect the upper bonding pads to the lower bonding pads, thereby providing electrical connections between the solder balls/columns and the bonding pads of the die which are similar in length to those of the standard PBGA package. Further, because the die and solder balls are mounted on opposite sides of the substrate, the BGA package in accordance with the present invention permits convenient probe testing of the wire bonding connections using techniques developed for the standard PBGA package, thereby overcoming a significant problem associated with the super BGA package. After testing, the encapsulation material is deposited in the recessed area over the die and wires, and the EMI/RFI shield is optionally mounted on the upper surface of the heat sink portion over the die, wires and encapsulation material.

BRIEF DESCRIPTION OF THE DRAWINGS

These and other features, aspects, and advantages of the present invention will become better understood with the following description, appended claims, and accompanying drawings where:

DETAILED DESCRIPTION

Figure 1A:
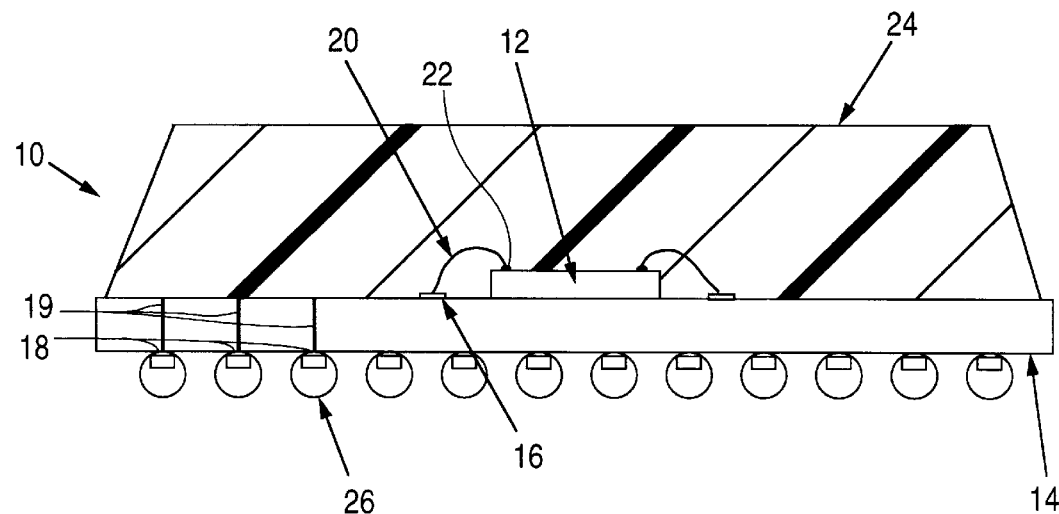
FIG. 1(A) is a cross sectional view of a conventional PBGA package.
Figure 1B:
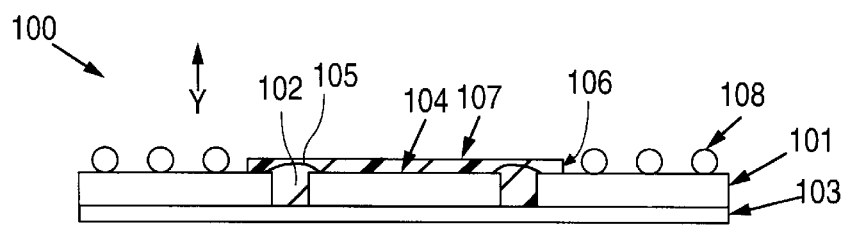
FIG. 1(B) is a cross sectional view of a conventional super BGA package.
Figure 2A:
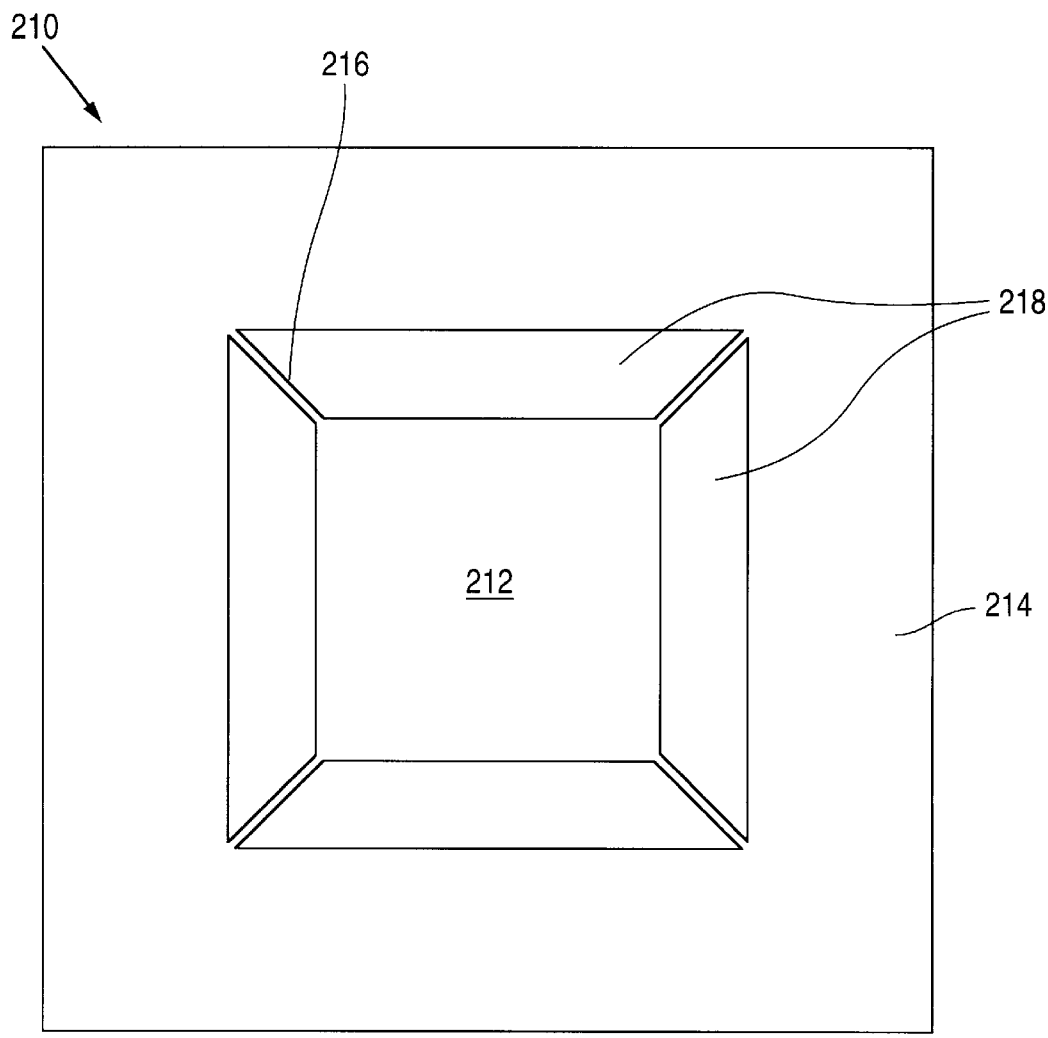
FIGS. 2(A) and 2(B) are plan and cross sectional views, respectively, a heat dissipating frame in accordance with an embodiment of the present invention.
Figure 2B:
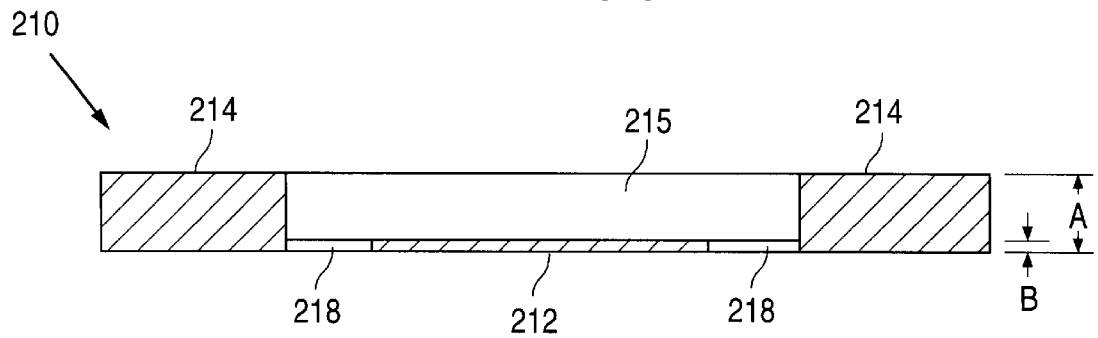

FIGS. 2(A) and 2(B) show a heat dissipating member 210 in accordance with a first embodiment of the present invention. Heat dissipating member 210 includes a thin, flat die attach portion 212 and a relatively thick heat sink portion 214 surrounding an outer peripheral edge of die attach portion 212, thereby forming a recessed area 215. Four diagonally-projecting rod-like tie bars (thermal conductors) 216 extend between the peripheral edge of die attach portion 212 and an inner peripheral edge of heat sink portion 214. Openings 218 are defined between the peripheral edge of die attach portion 212 and an inner edge of heat sink portion 214.

As shown in FIG. 2(B), a (second) thickness A measured between upper and lower surfaces of heat sink portion 214 is greater than a (first) thickness B measured between upper and lower surfaces of die attach portion 212. The lower surface of die attach portion 212 is preferably co-planar with the lower surface of heat sink portion 214, but may be offset. In accordance with an aspect of the present invention, the difference between the thicknesses A and B is equal to or greater than a thickness of the die (not shown in FIG. 2(B)) which is mounted on die attach portion 212 of heat dissipating member 210. For example, for a die having a thickness of 12–16 mils, a typical thickness A of heat sink portion 214 is approximately 30 mils, and a thickness B of die attach portion is 6 mils. These dimensions allow encapsulation material to completely cover the die and connection wires in recessed area 215 such that an upper surface of the encapsulation material is co-planar with an upper surface of heat sink portion 214. As discussed below, when heat sink portion 214 is electrically grounded and a metal plate is mounted on the upper surface of heat sink portion 214, a Faraday cage is formed which blocks electromagnetic interference (EMI) and radio frequency interference (RFI).

FIGS. 2(A) and 2(B) show heat dissipating member 210 as a single member which is, for example, stamped or etched from a single piece of copper (or other thermally conductive material) to form die attach portion 212 and heat sink portion 214. Alternatively, heat dissipating member may be formed by stamping or etching a flat member including die attach portion 212, tie bars 216 and a peripheral apron, all having the thickness B shown in FIG. 2(B), then attaching a heat sink portion having a thickness which is equal to B–A. One of ordinary skill in the art will also recognize that heat dissipating member 210 may be constructed using several other methods.

In accordance with another embodiment of the present invention, a method is provided for forming an electronic device using a BGA package incorporating heat dissipating member 210. This method is described with the aid of FIGS. 3(A) through 6.

Figure 3A:
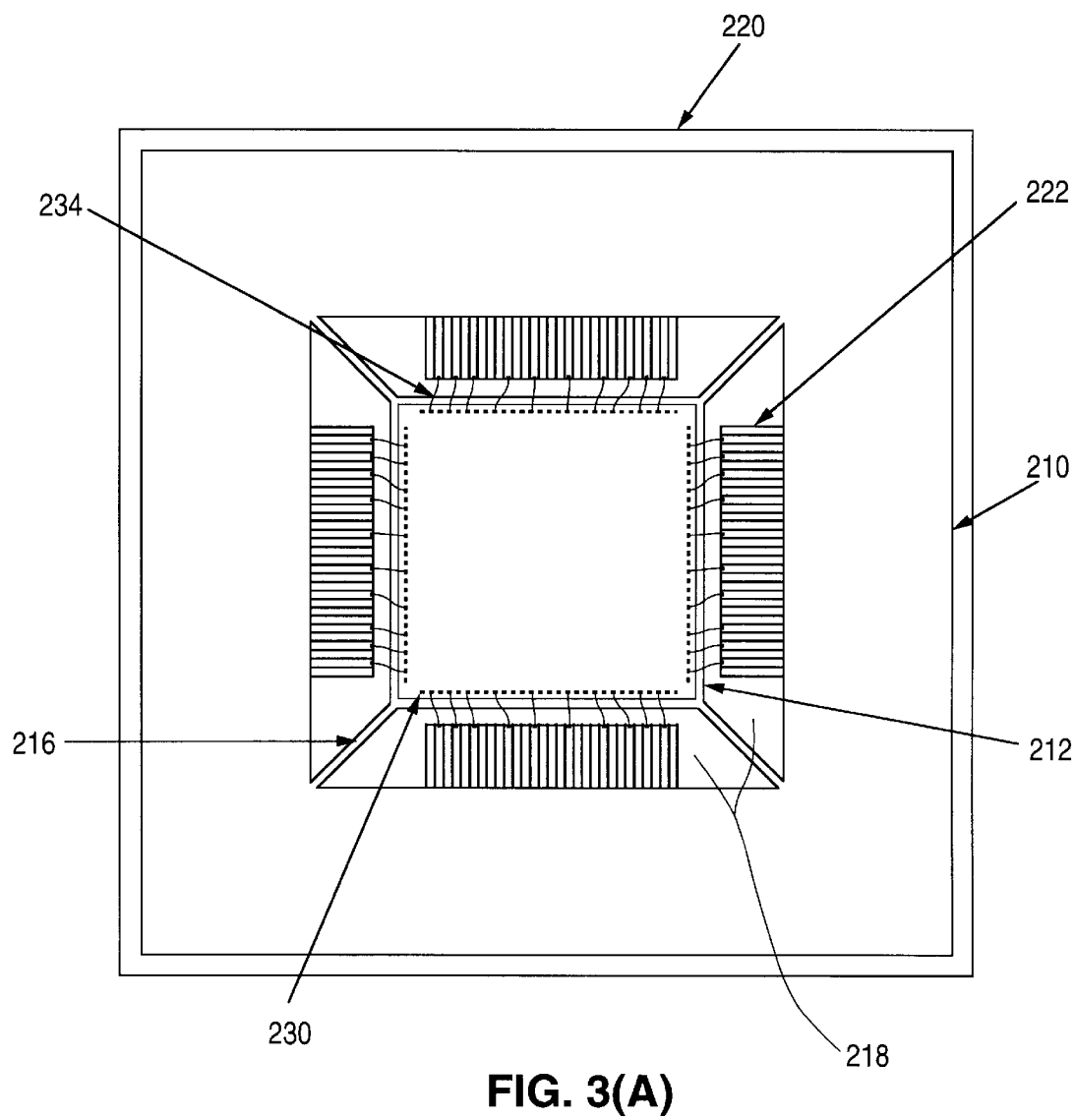
FIGS. 3(A) and 3(B) are plan and cross sectional views, respectively, showing a partially assembled BGA package in accordance with the present invention.
Figure 3B:
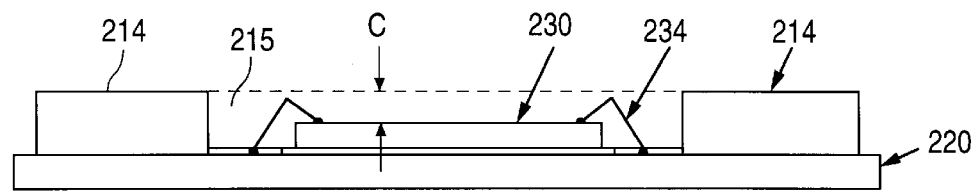

Referring to FIGS. 3(A) and 3(B), heat dissipating 210 is mounted onto a ceramic or plastic substrate 220 such that openings 218 are positioned over inner bonding pads 222 formed on an upper surface of substrate 220. Substrate 220 is similar to substrate 14 of standard PBGA 10 (discussed above) in that inner (upper) bonding pads 222 and electrical conductors are formed on an upper surface, and conductive vias extending through the substrate to lower bonding pads 250. Therefore, the effective inductance of the BGA package is lower than super BGA package 100 due to shorter signal paths. Heat dissipating member 210 is attached to the upper surface of substrate 220 using non-conductive tape, epoxy or other (preferably electrically non-conductive) attaching materials. In addition, heat dissipating member 210 is electrically connected to a ground line formed on substrate 220 (that is, a line connected to a ground potential when the BGA package is mounted on a PCB or other structure). This establishes heat dissipating member 210 as a ground plane which further reduces the effective inductance of the BGA package.

In other embodiments of the present invention, heat sink portion 214 may be attached to tape automated bonding (TAB) tape, a metal lead frame, or any other structure (collectively referred to herein as a substrate).

After attaching heat dissipating member 210 to substrate 220, a die 230 is mounted into recessed area 215 and attached to the upper surface of die attach portion 212 using known die-attach epoxy, tape or other (preferably electrically non-conductive) attaching materials. As shown in FIG. 2(B), an upper surface of die 212 is located a distance C below the upper surface of heat sink portion 214. Stated differently, die 230 is located entirely between a pair of planes respectively defined by the upper and lower surfaces of heat sink portion 214.

After attaching die 230 to die attach portion 212, bonding pads located on the peripheral edge of die 212 are connected to upper bonding pads 222 using wire-bonding techniques such that each wire 234 electrically connects one bonding pad of die 212 with one upper bonding pad 222.

Figure 4A:
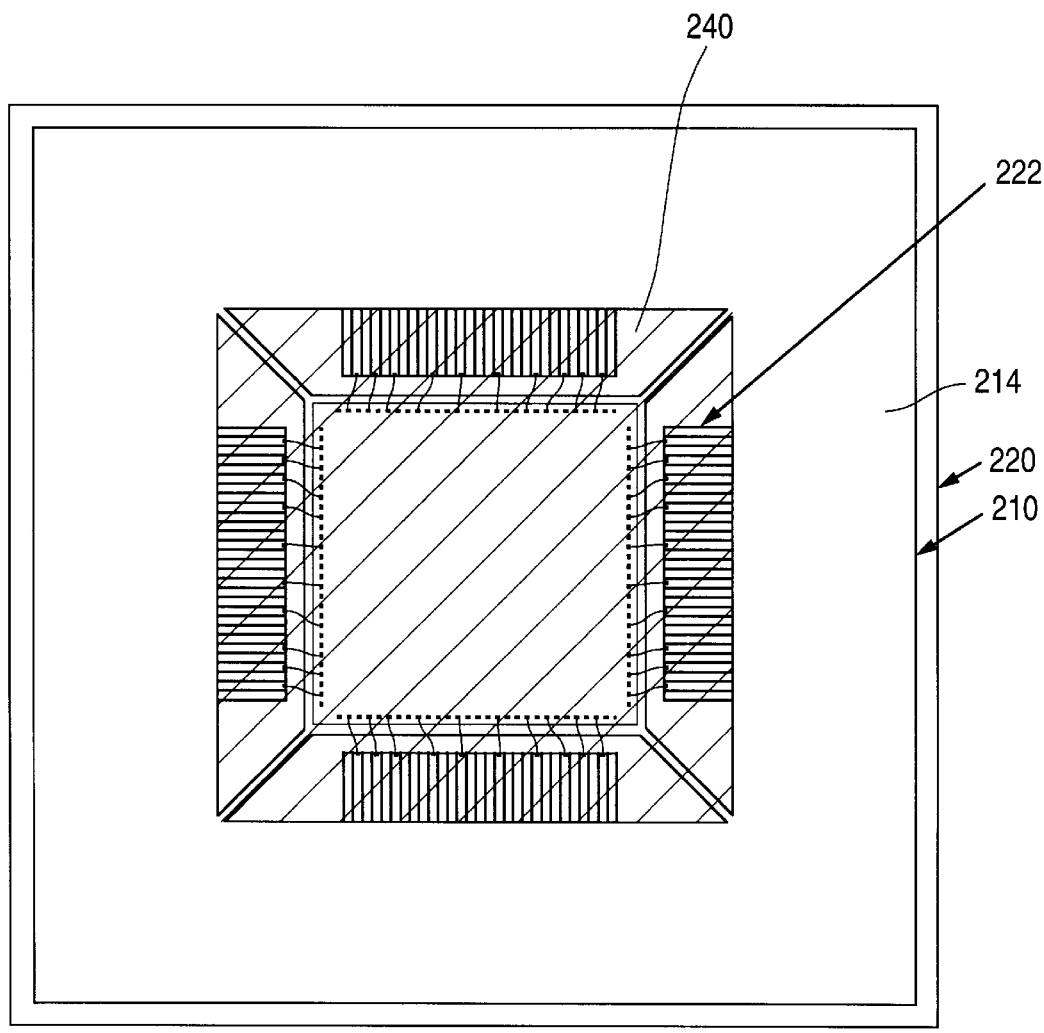
FIGS. 4(A) and 4(B) are plan and cross sectional views, respectively, showing the BGA package of FIG. 3 after blob dispense.
Figure 4B:
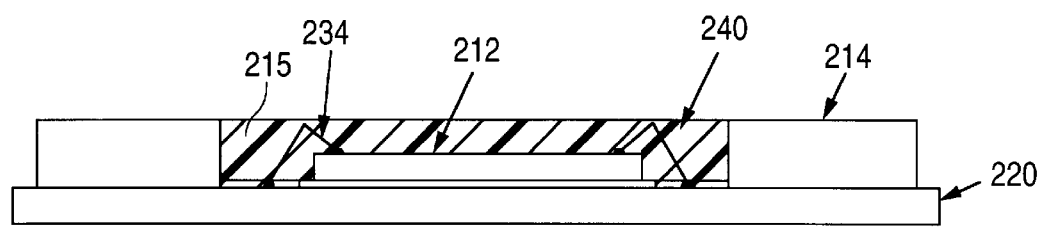

Referring to FIGS. 4(A) and 4(B), encapsulation material 240 is then dispensed into recessed area 215 such that die 212 and wires 234 are completely covered by encapsulation materials, while the upper surface of heat sink portion 214 remains exposed (that is, not covered by encapsulation material 240). In accordance with the embodiment shown in FIG. 4(B), this encapsulation step may be performed using known plastic molding processes or blob topping processes. Preferably, blob top material is used which fills recessed area 215 such that an upper surface of encapsulation material 240 is co-planar with the upper surface of heat sink portion 214.

Figure 5A:
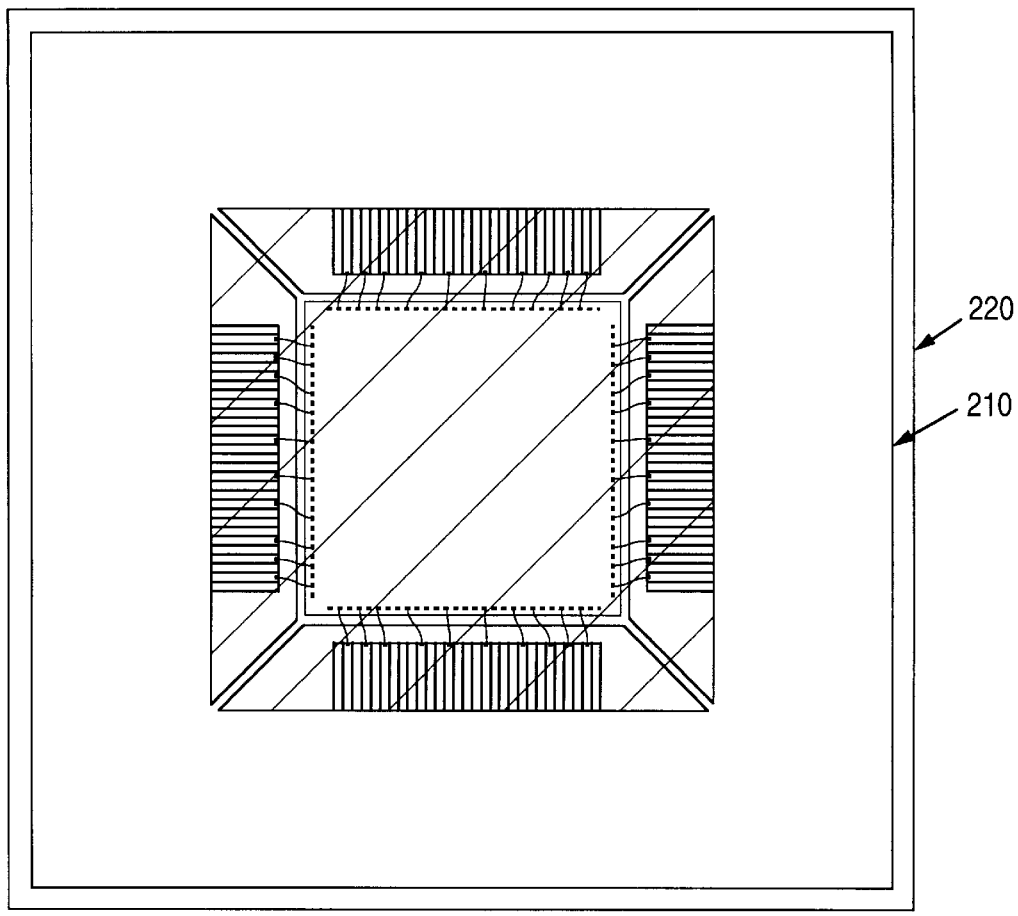
FIGS. 5(A) and 5(B) are plan and cross sectional views, respectively, showing the BGA package of FIG. 4 after ball attachment.
Figure 5B:
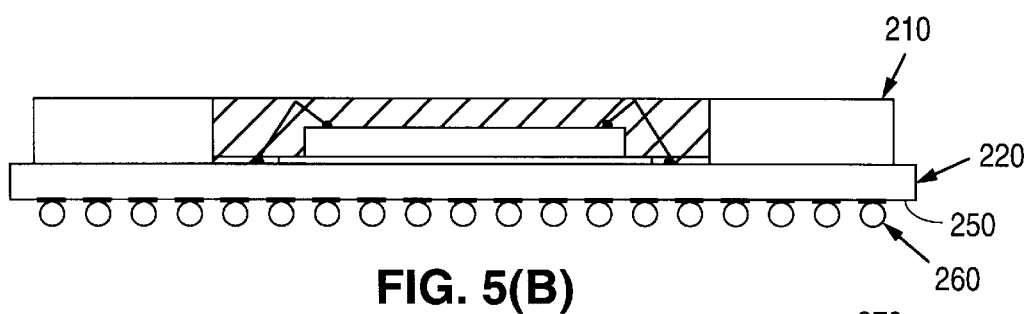

Referring to FIGS. 5(A) and 5(B), during the next manufacturing step, solder balls 260 are attached to lower bonding pads 250 formed on the substrate (or lead frame) 220. When a substrate is used, upper bonding pads 222 are electrically connected to lower bonding pads 250 by conductive vias using known techniques.

Figure 6:
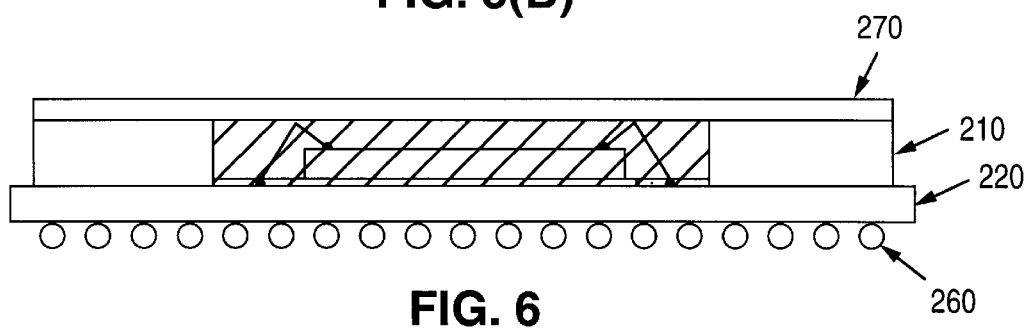
FIG. 6 is a cross sectional view showing a BGA package in accordance with the present invention.

Referring to FIG. 6, a final step of the manufacturing process includes attaching a metal plate 270 onto the upper peripheral surface of heat sink portion 214. In a preferred embodiment, plate 270 is a copper plate which is electrically connected to heat dissipating member 210 (which is maintained at a ground potential), thereby forming a Faraday cage around die 230. The Faraday cage formed by heat dissipating member 210 and plate 270 prevents EMI/RFI radiated by die 230 from interfering with adjacent circuitry in, for example, wireless and telecommunication applications. In addition, in electronic devices where die 230 is sensitive to EMI/RFI, the Faraday cage protects die 230 from EMI/RFI. Further, plate 270 acts as an additional heat sink member to dissipate heat conducted from heat sink portion 214.

When an electronic device including the BGA package of the present invention (such as the device shown in FIG. 6) is mounted onto a host PCB, solder balls 260 are attached to interconnect pads of the PCB using, for example, a known re-flow process. During this process, a ground line of the BGA package is connected through the PCB to a ground potential, thereby establishing heat dissipating member 210 as a ground plane.

During subsequent operation, heat generated by die 230 is transmitted through metal die attach portion 212 to heat sink portion 214 along tie bars 216, thereby effectively conducting heat away from die 230 to maintain an optimal die operating temperature. Therefore, the BGA package of the present invention provides enhanced thermal characteristics over standard PBGA package 10 (discussed above).

Further, because heat dissipating member 210 acts as a ground plane, the inductive effects on signals passing between die 230 and the PCB are substantially less than those of super BGA package 100 (discussed above).

While particular embodiments of the present invention have been shown and described, it will be obvious to those skilled in the art that changes and modifications may be made without departing from this invention in its broader aspects. For example, heat dissipating member 210 may be molded instead of being formed stamping or etching. In addition, heat dissipating member 210 can be formed to have a peripheral edge formed in any geometric shape, provided it includes structures related to die attach portion 212, heat sink portion 214 and tie bars 215, as described above. Further, heat dissipating member 210 may be used in non-BGA package types, such as plastic quad flat pack (PQFP), plastic pin grid array (PPGA) packages, over molded PCM-CIA modules, and other FR4 type substrates in which integrated circuits are similarly attached. Moreover, any number of tie bars 215 may be used to connect die attach portion 212 with heat sink portion 214. Therefore, the appended claims are intended to encompass within their scope all such changes and modifications which fall within the true spirit and scope of this invention.

We claim:

1. An electronic device comprising:
   an integral heat dissipating member including:
      a flat die attach portion having an upper surface and a lower surface, a distance between the upper and lower surfaces defining a first thickness, the die attach portion having an outer peripheral edge,
      a heat sink portion surrounding the die attach portion, the heat sink portion having an upper surface which is parallel to the upper surface of the die attach portion, the heat sink portion having a lower surface which is parallel to the lower surface of the die attach portion, a distance between the upper and lower surfaces of the heat sink portion defining a second thickness, the heat sink portion also having an inner peripheral edge,
      a plurality of rod-like thermal conductors directly coupling the outer peripheral edge of the die attach portion to the inner peripheral edge of the heat sink portion; and
      an integrated circuit die mounted on the die attach portion, the integrated circuit die having a third thickness;
         wherein the first thickness of the die attach portion is less than the second thickness of the heat sink portion;
         wherein the third thickness of the integrated circuit die is less than a difference between the first thickness and the second thickness,
         wherein the lower surface of the die attach portion is co-planar with the lower surface of the heat sink portion; and
         wherein the integrated circuit die is located entirely between a first plane defined by the upper surface of the heat sink portion and a second plane defined by the lower surfaces of the die attach portion and the heat sink portion.

2. The electronic device according to claim 1, wherein a metal plate is mounted on the upper surface of the heat sink portion.

3. An electronic device comprising:
   an integral heat dissipating member including:
      a flat die attach portion having an upper surface and a lower surface, a distance between the upper and lower surfaces defining a first thickness, the die attach portion having an outer peripheral edge,
      a heat sink portion surrounding the die attach portion, the heat sink portion having an upper surface which is parallel to the upper surface of the die attach portion, the heat sink portion having a lower surface which is parallel to the lower surface of the die attach portion, a distance between the upper and lower surfaces of the beat sink portion defining a second thickness, the heat sink portion also having an inner peripheral edge,
      a plurality of rod-like thermal conductors directly coupling the outer peripheral edge of the die attach portion to the inner peripheral edge of the heat sink portion; and
      an integrated circuit die mounted on the-die attach portion, the integrated circuit die having a third thickness; wherein the first thickness of the die attach portion is less than the second thickness of the heat sink portion; wherein the third thickness of the intergrated circuit die is less then a difference between the first thickness and the second thickness;
      wherein a plurality of openings are defined between the outer peripheral edge of the die attach portion and the inner peripheral edge of the heat sink portion, and wherein a plurality of wires are connected to the die and extend through the opening.

4. An electronic device comprising:
   an integral heat dissipating member including:
      a flat die attach portion having an upper surface and a lower surface, a distance between the upper and lower surfaces defining a first thickness, the die attach portion having an outer peripheral edge,
      a heat sink portion surrounding the die attach portion, the heat sink portion having an upper surface which is parallel to the upper surface of the die attach portion, the heat sink portion having a lower surface which is parallel to the lower surface of the die attach portion, a distance between the upper and lower surfaces of the heat sink portion defining a second thickness, the heat sink portion also having an inner peripheral edge,
      a plurality of rod-like thermal conductors directly coupling the outer peripheral edge of the die attach portion to the inner peripheral edge of the heat sink portion; and
      an integrated circuit die mounted on the die attach portion, the integrated circuit die having a third thickness wherein the first thickness of the side attach portion is less than the second thickness of the heat sink portion; wherein the third thickness of the integrated circuit die is less than a difference between the first thickness and the second thickness;
      wherein the heat dissipating member is formed from an integral piece of copper.

5. An electronic device comprising:
   a substrate having opposing first and second surfaces, the substrate including a plurality of first bonding pads formed on the first surface;
   a heat dissipating member including:
      a die attach portion having a lower surface mounted on the first surface of the substrate, the die attach portion also having an upper surface,
      a heat sink portion surrounding the die attach portion, the heat sink portion having a lower surface mounted on the first surface of the substrate, the heat sink portion also having an upper surface, and
      a plurality of thermal conductors extending between the die attach portion and the heat sink portion, the plurality of conductors being spaced apart such that a plurality of openings are formed between the die attach portion and the heat sink portion;
   an integrated circuit die mounted on the upper surface of the die attach portion, the integrated circuit die including a plurality of bonding pads, each bonding pad being electrically connected to one of the plurality of first bonding pads by one of a plurality of wires extending through one of the plurality of openings formed between the die attach portion and the heat sink portion of the heat dissipating member;

a plurality of solder balls attached to the second surface of the substrate; and an encapsulation material disposed to cover the integrated circuit die and the plurality of wires.

6. The electronic device according to claim 5, wherein the integrated circuit die is located entirely between a first plane defined by the upper surface of the heat sink portion and a second plane defined by the lower surfaces of the die attach portion and the heat sink portion.

7. The electronic device according to claim 6, wherein a distance between the upper and lower surfaces of the die attach portion defines a first thickness, a distance between the upper and lower surfaces of the heat sink portion defining a second thickness, and a distance between upper and lower surfaces of the integrated circuit die defines a third thickness;

wherein the first thickness of the die attach portion is less than the second thickness of the heat sink portion; and wherein the third thickness of the integrated circuit die is less than a difference between the first thickness and the second thickness.

8. The electronic device according to claim 5, wherein a metal plate is mounted on the upper surface of the heat sink portion, thereby forming a Faraday cage around the integrated circuit die.

9. The electronic device according to claim 5, wherein the heat dissipating member is formed from an integral piece of copper.

* * * * *